(12) United States Patent
Sehgal et al.

(10) Patent No.: US 9,406,396 B2
(45) Date of Patent: Aug. 2, 2016

(54) INTRINSIC MEMORY BLOCK HEALTH MONITORING

(71) Applicant: SanDisk Technologies Inc., Plano, TX (US)

(72) Inventors: Rohit Sehgal, Milpitas, CA (US); Nian Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/560,698

(22) Filed: Dec. 4, 2014

(65) Prior Publication Data

US 2016/0163397 A1  Jun. 9, 2016

(51) Int. Cl.
*G11C 16/06* (2006.01)
*G11C 16/34* (2006.01)
*G11C 16/10* (2006.01)
*G11C 16/26* (2006.01)

(52) U.S. Cl.
CPC .............. *G11C 16/349* (2013.01); *G11C 16/10* (2013.01); *G11C 16/26* (2013.01); *G11C 16/3459* (2013.01)

(58) Field of Classification Search
CPC ................... G11C 11/5628; G11C 2211/5621; G11C 11/5621; G11C 11/5642; G11C 16/0483; G11C 16/10; G11C 16/16; G11C 16/26; G11C 2211/5641; G11C 29/00; G11C 29/52
USPC ............. 365/185.03, 185.17, 185.22, 189.07, 365/200, 185.12, 185.11
See application file for complete search history.

(56) References Cited

U.S. PATENT DOCUMENTS

2010/0115325 A1*  5/2010  Lin ..................... G06F 11/1068
                                                         714/2

* cited by examiner

*Primary Examiner* — Thong Q Le
(74) *Attorney, Agent, or Firm* — Brinks Gilson & Lione

(57) ABSTRACT

A memory system or flash card may monitor the health of memory and the user data stored by detecting and storing a number of bits in error for each block. This detection can be used to determine where user data should be programmed and which blocks should be cycled. The erratic bits are detected after a programming and the listing for each block is updated. When the erratic bits exceed a threshold for a particular block, that block may be cycled or retired.

19 Claims, 9 Drawing Sheets

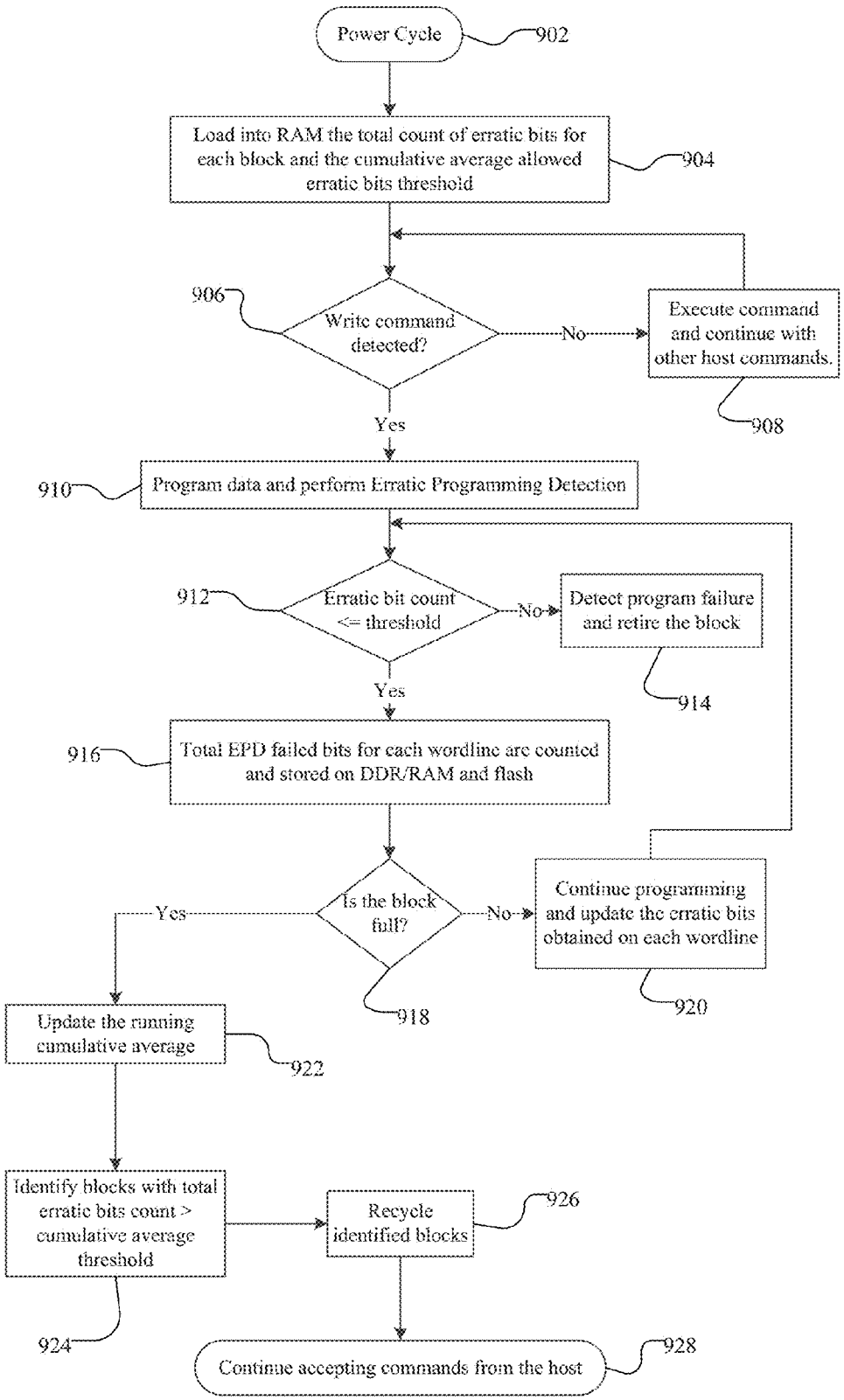

INTRINSIC MEMORY BLOCK HEALTH MONITORING

TECHNICAL FIELD

This application relates generally to memory devices. More specifically, this application relates to the improving memory lifetime by measuring and monitoring erratic bits intrinsic to non-volatile semiconductor flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may have a limited endurance, which determines a number of times a particular memory can be erased and re-programmed. In particular, memory blocks may be subject to cycling during the run time of the card and due to the disparity between blocks due to cycling, some blocks may develop error counts faster than other blocks leading to memory failure if the data in these blocks is not moved to good blocks (with less or no error counts). In order to determine the number of times a block has been cycled (erased and programmed), a number called hot count may be used. The hot count may be used to determine which memory blocks to cycle. However, the hot count may not be an accurate reflection of the health of a memory block. For example, blocks with high hot count may still be healthy and have a long lifetime, while blocks with low hot count may be bad blocks that will fail.

SUMMARY

The hot count may not take into account the number of bits that were either programmed in error or developed a bad distribution during the run time of the card which could otherwise be obtained by doing an intrinsic measurement. The true count of the number of bits in error when a block was programmed may be a more accurate reflection of the health of a block. More accurate block health measurements can be used for identifying bad blocks for cycling purposes. In order to enhance the life of user data on flash drives, the number of erratic bits intrinsic to the flash device may be calculated for all blocks. This number of erratic bits may be stored and updated. If the number of erratic bits is nearing an allowed threshold or more than the allowed threshold value, the data in the block may be moved to a known good block and the current block may be recycled. This process may increase the life of the user data on the memory by moving it to a known good block which provides good distribution of the data.

BRIEF DESCRIPTION OF THE DRAWINGS

FIG. 9 is a diagram of an exemplary process for implementing erratic program detection.

DESCRIPTION OF THE EMBODIMENTS

The memory system and methods described monitor the health of memory and the user data stored by detecting and recording a number of bits in error for each block. This detection can be used to determine where user data should be programmed and which blocks should be cycled. The recorded erratic bits may be updated after programming. When the erratic bits exceed a threshold for a particular block, that block may be cycled or retired. An erratic bit is a bit that is not programmed to the desired state. In other words, when there is an attempt to program a bit is to a certain state, but a subsequent read of that bit results in a different state, then the bit is erratic or in error.

Figure 1A:
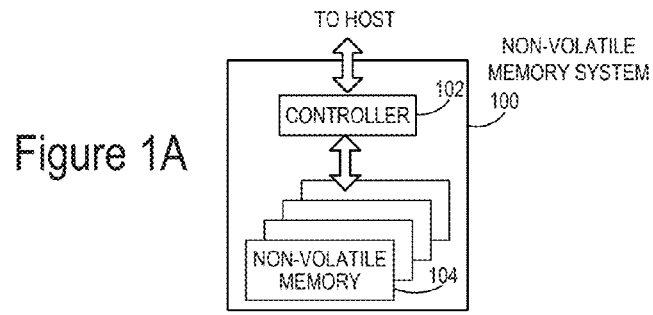
FIG. 1A is a block diagram illustrating a non-volatile memory system.

FIG. 1A is a block diagram illustrating a non-volatile memory system according to an embodiment of the subject matter described herein. Referring to FIG. 1A, non-volatile memory system 100 includes a controller 102 and one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

Examples of host systems include, but are not limited to, personal computers (PCs), such as desktop or laptop and other portable computers, tablet computers, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or software to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, system 100 may be a card based system. Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. Each of these memory cards and flash drives may include controllers that interface with the host and control operation of the flash memory within them.

The flash memory may be embedded within the host, such as in the form of a solid state disk (SSD) drive installed in a personal computer. Alternatively, the memory 102 may be in the form of a flash memory card that is removably connected to the host. In an alternate embodiment, system 100 may be part of an embedded memory system.

Although in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
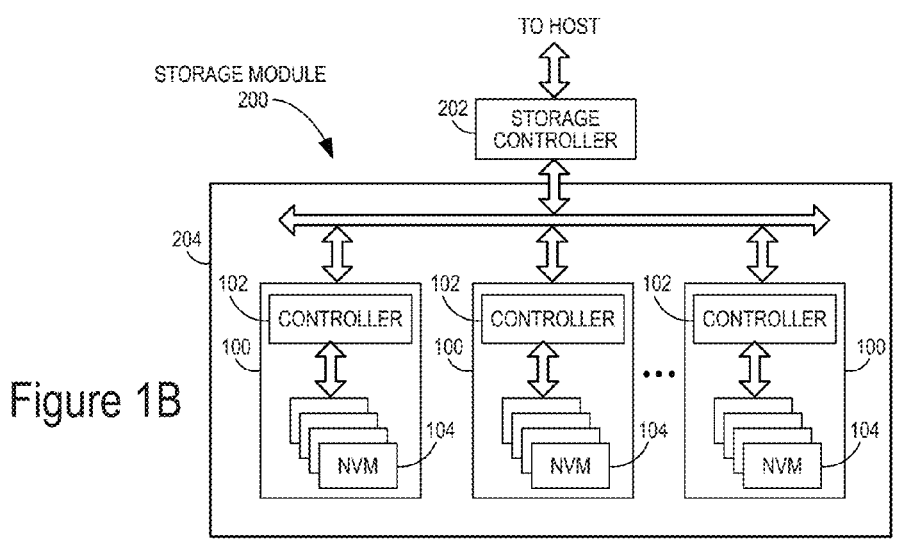
FIG. 1B illustrates a storage module that includes a plurality of non-volatile memory systems.

FIG. 1B illustrates a storage module 200 that includes a plurality of non-volatile memory systems 100. As such, storage module 200 may include a storage controller 202 that interfaces with a host and with memory system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage system 200 illustrated in FIG. 1B, in one embodiment, may be a solid state drive (SSD), such as found in portable computing devices, such as laptop computers, tablet computers, and mobile phones.

Figure 1C:
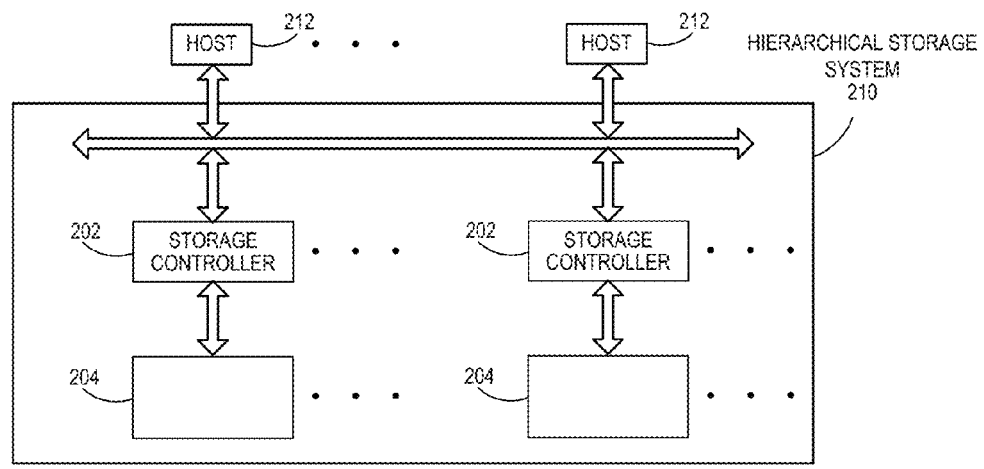
FIG. 1C is a block diagram illustrating a hierarchical storage system.

FIG. 1C is a block diagram illustrating a hierarchical storage system according to an embodiment. Referring to FIG. 1C, a hierarchical storage system 210 includes a plurality of storage controllers 202, each of which control a respective memory system 204. Host systems 212 may access memories within the storage system via a bus interface. In one embodiment, the bus interface may be a serial attached SCSI (SAS) or fiber channel over Figure (FCoE) interface. In one embodiment, the system illustrated in FIG. 1C may be a rack mountable mass storage system that is accessible by multiple host computers, such as would be found in a data center or other location where mass storage is needed.

Figure 2A:
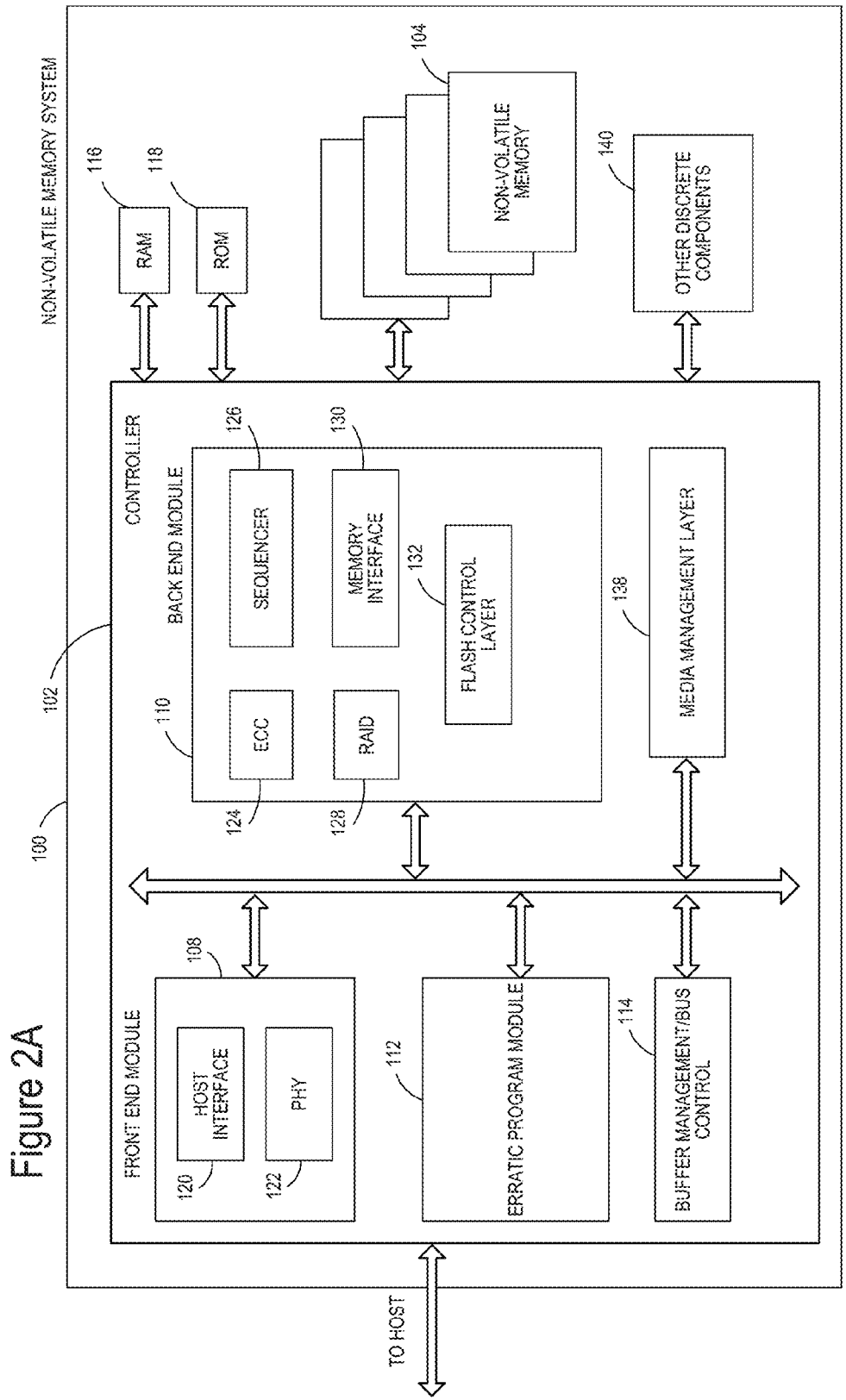
FIG. 2A is a block diagram illustrating exemplary components of controller.

FIG. 2A is a block diagram illustrating exemplary components of controller 102 in more detail. Referring to FIG. 2A, controller 102 includes a front end module 108 that interfaces with a host, a back end module 110 that interfaces with the one or more non-volatile memory die 104, and various other modules that perform functions which will now be described in detail. In the illustrated example, these modules include an erratic program module 112 that performs the storage and accessing of erratic bit counts. The functions of the erratic program module 112 are further described below and may be performed for the controller 102. A buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Front end module 108 includes a host interface 120 and a physical layer interface (PHY) 122 that provide the electrical interface with the host or next level memory controller.

Back end module 110 includes an error correction controller (ECC) engine 124 that performs encoding on the data bytes received from the host, and decoding and error correction on the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a dual data rate (DDR) interface, such as a Toggle Mode 200, 400, or 800 interface. A flash control layer 132 controls the overall operation of back end module 110.

Additional components of system 100 illustrated in FIG. 2A include media management layer (MML) 138 (also referred to as the flash transformation layer), which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
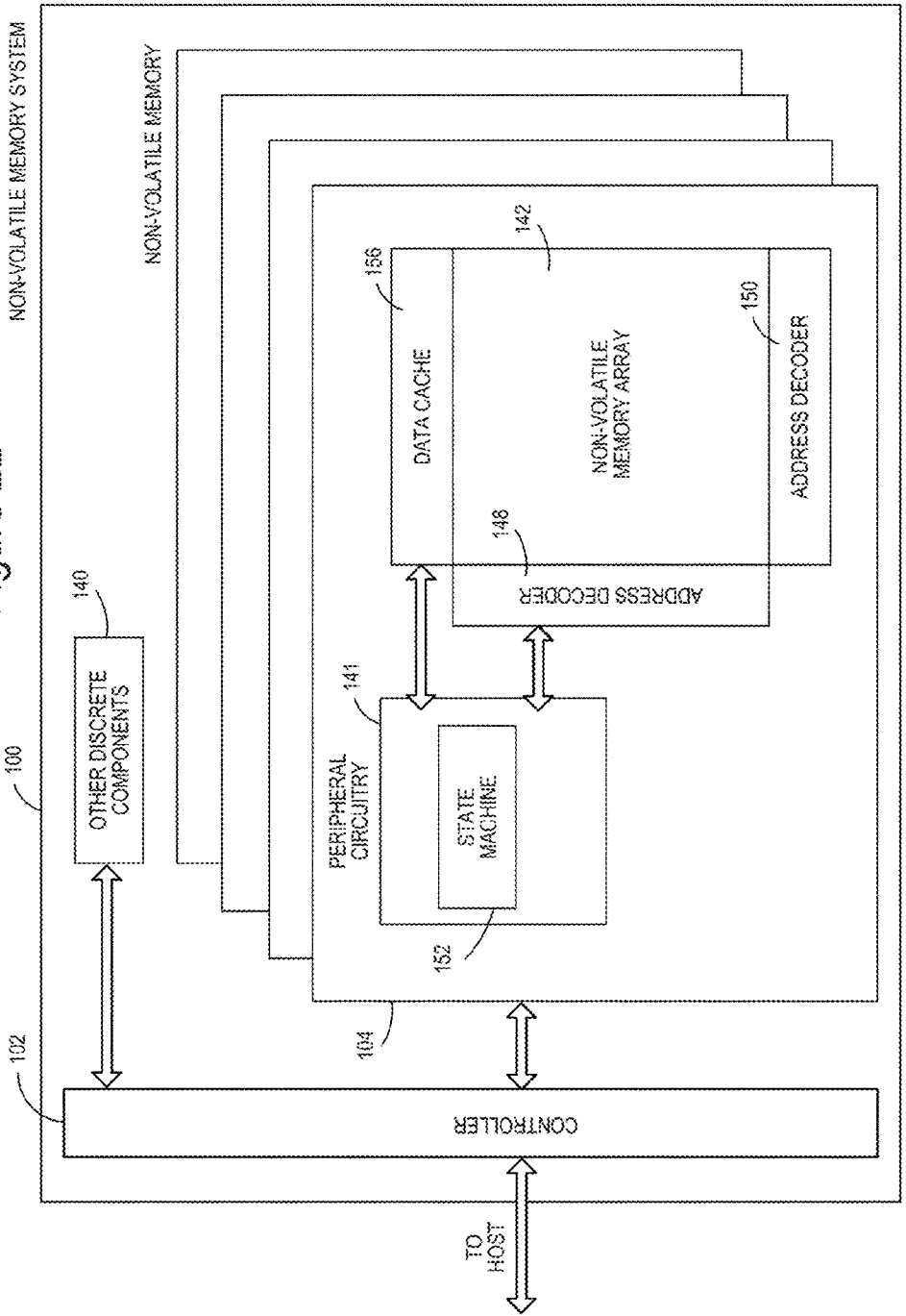
FIG. 2B is a block diagram illustrating exemplary components of non-volatile memory die.

FIG. 2B is a block diagram illustrating exemplary components of non-volatile memory die 104 in more detail. Referring to FIG. 2B, non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. The state machine 152 may generate/identify erratic bits as further described below. Those erratic bits may be stored for further reference. Non-volatile memory die 104 further includes a data cache 156 that caches data.

Figure 3:
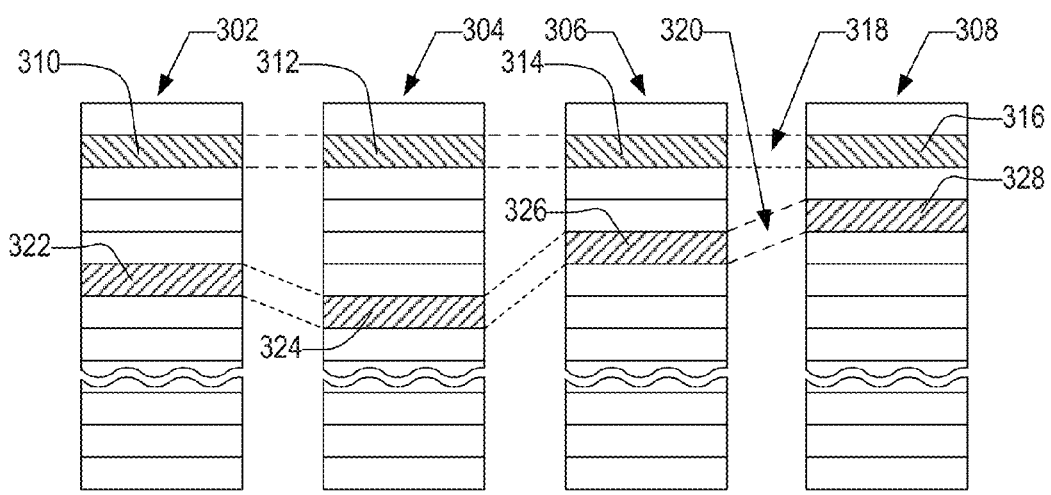
FIG. 3 is an example physical memory organization of the system of FIGS. 1A-2B.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below, the sentinel blocks may be an individual block or a combination of blocks, including one or more metablocks.

Figure 4:
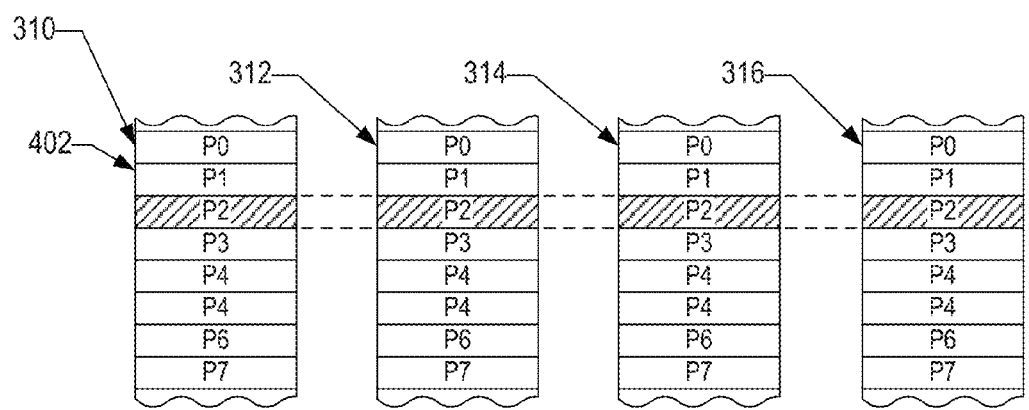
FIG. 4 is an expanded view of a portion of the physical memory of FIG. 3.

The individual blocks are in turn divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 4, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 5:
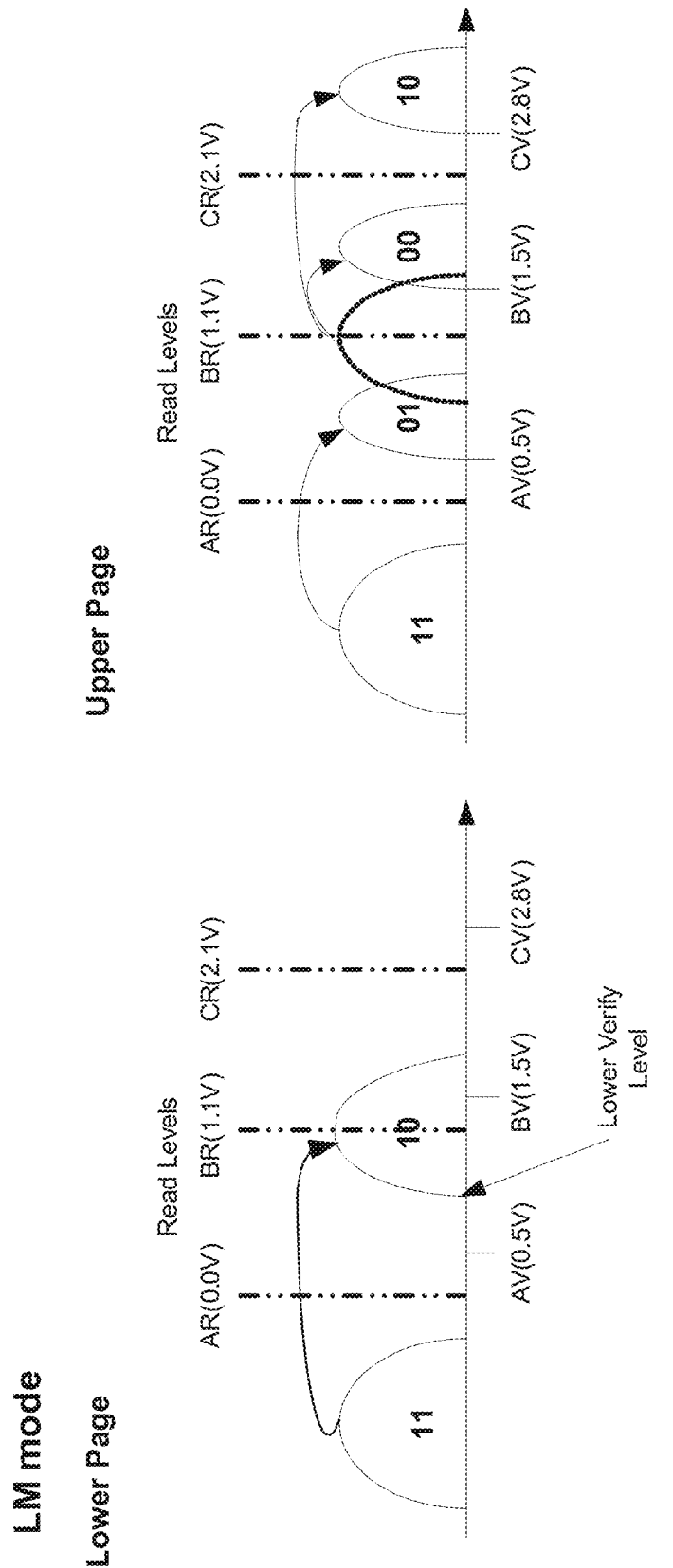
FIG. 5 is a diagram illustrating charge levels in a multi-level cell memory operated to store two bits of data in a memory cell.

FIG. 5 illustrates one implementation of the four charge levels used to represent two bits of data in a memory cell. FIG. 5 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Electrons for each of the charge values may be lost over time, which may eventually result in data loss. Increased temperatures may accelerate the electron loss. Likewise, extended time or exposure to high temperatures may result in a shift of the levels (i.e. thresholds) shown in FIG. 5. In particular, this shift may result in a measurable movement of the sense threshold minima. This level shift may result in a change of a value (e.g. from a value of 1 to 0 in a particular cell) which is an example of a DR failure. In other words, DR problems may be caused in part by the environmental changes. Increased temperature may further cause the charge in a particular cell to move levels.

Figure 6:
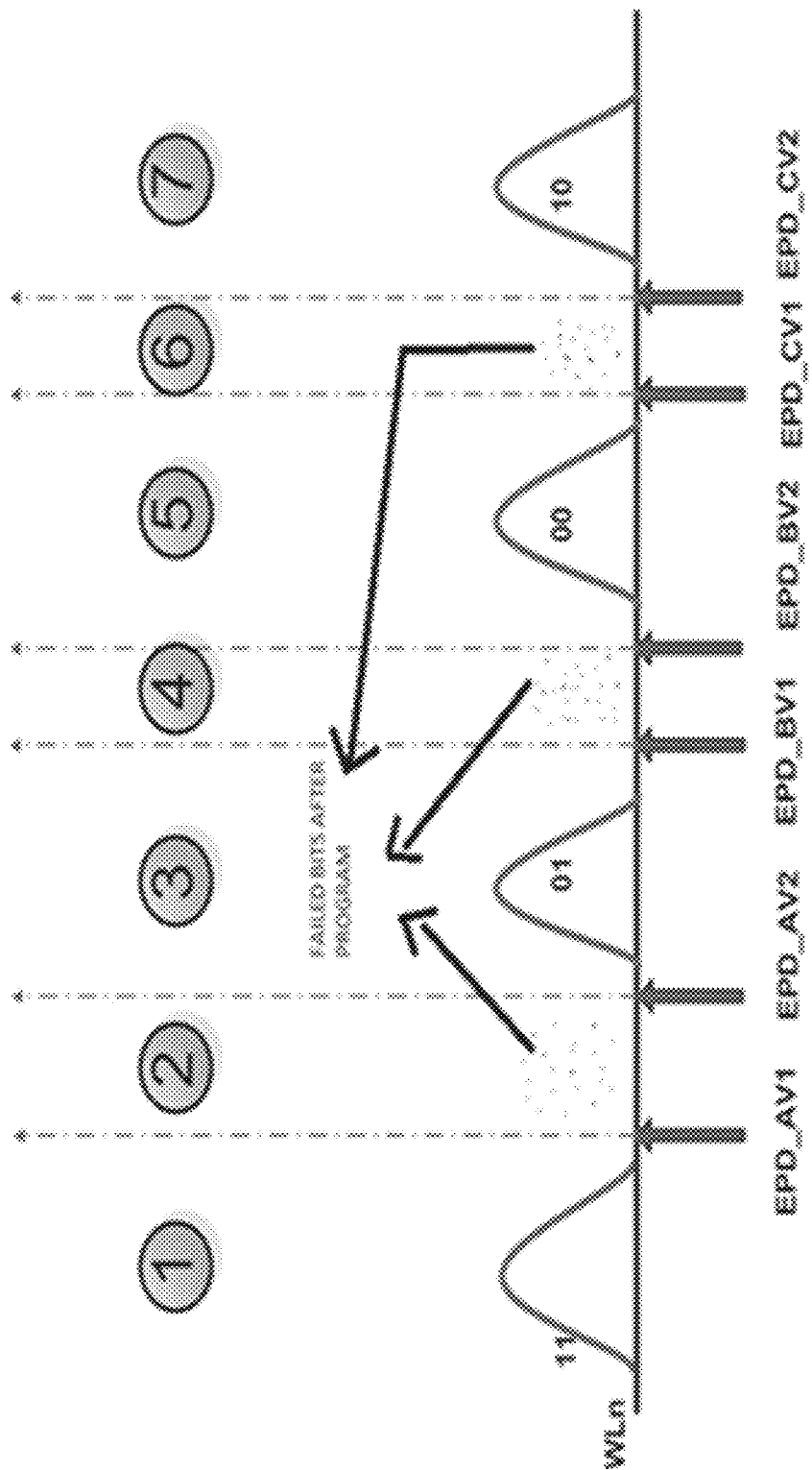
FIG. 6 is a diagram illustrating erratic bits within charge levels.

FIG. 6 is a diagram illustrating erratic bits within charge levels. As part of the erratic bit detection (also referred to as failed bit detection or erratic program detection), there may an extra step performed after each program operation. This may be performed by the state machine in one example. The erratic bit detection comprises identifying any erratic bits after a program operation, such as with a read operation that confirms whether the bit was programmed to the state that was intended. FIG. 6 illustrates where those potential erratic bits (i.e. failed bits) may be located. FIG. 6 shows four states and any bits that are programmed outside of those four states is an erratic bit. In particular, the four states may correspond with two bits of data in a memory cell. State 1 may be called the Erase state and corresponds with a data value of 11. State 3 may be called State A, and corresponds with a data value of 01. State 5 may be called State B, and corresponds with a data value of 00. State 7 may be called State C, and corresponds with a data value of 10. States 2, 4, and 6 are in between actual charge level states.

Each of the States are determined based on voltage level that is programmed. The voltage level identifies which of the States that a particular cell is programmed at. If the programmed voltage for a particular, cell is outside one of the four states (States 1, 3, 5 7, or Erase state and States A-C), then there is an erratic bit (i.e. bit in States 2, 4, or 6). State 2 would correspond with a voltage level between EPD_AV1 and EPD_AV2, where EPD_AV1 is the maximum voltage for State 1 and EPD_AV2 is the minimum voltage for State 3. State 4 would correspond with a voltage level between EPD_BV1 and EPD_BV2, where EPD_BV1 is the maximum voltage for State 3 and EPD_BV2 is the minimum voltage for State 5. State 6 would correspond with a voltage level between EPD_CV1 and EPD_CV2, where EPD_CV1 is the maximum voltage for State 5 and EPD_CV2 is the minimum voltage for State 7. Any bits that are programmed into the states 2, 4, and/or 6 are erratic bits.

The detection operation (e.g. read operation following a programming operation) shown in FIG. 6 may be performed after each program operation. The detection operation may include a read operation that determines the voltage level or charge level that was programmed. A bit is erratic if the bit is programmed between actual states (e.g. States 2, 4, or 6 in FIG. 6). In other words, a subsequent read operation does not result in the state that was intended to be programmed. In one embodiment, the entire memory may be subject to the detection operation program at manufacture. This may provide an initial list of erratic bits that is then updated with each future program operation.

Figure 7:
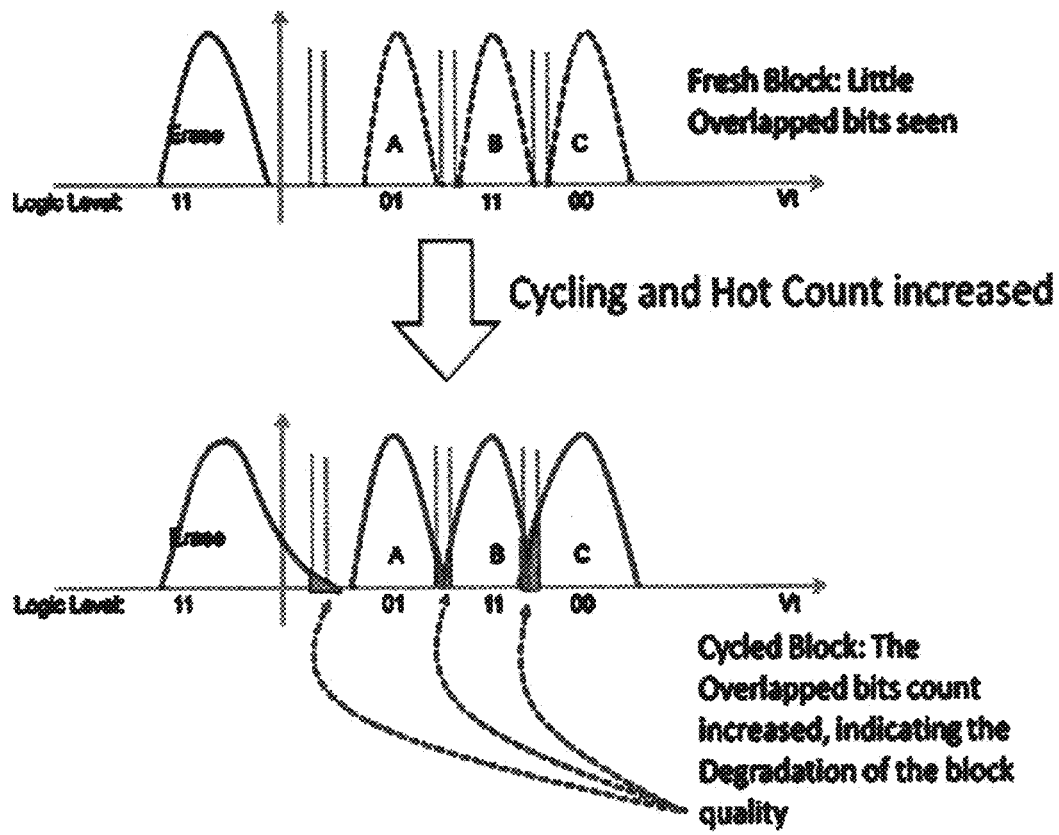
FIG. 7 is a diagram illustrating overlapped states.

FIG. 7 is a diagram illustrating overlapped states. The erratic bits in the overlapped states are an indication of block quality. An increased number of erratic bits indicates an unhealthy or low quality block. Likewise, fewer erratic bits are indicative of a healthier or higher quality block. FIG. 7 illustrates that as usage increases (e.g. cycling and/or hot count increased), the overlapped portions of states also increase. This overlap increases the chances of erratic bits. The top diagram in FIG. 7 illustrates a fresh/healthy block in which the states do not overlap, which is similar to the states shown in FIG. 6. However, the bottom diagram in FIG. 7 illustrates a used block where the states start to overlap with one another. Excessive usage of a block tends to wear out the block and make it more difficult to accurately program (i.e. set the voltage level). This degradation of the block quality/health results in increased overlapped or erratic bits. Any detection of a bit in one of the overlapped portions, shown in the bottom diagram of FIG. 7, is an erratic bit because a read operation cannot determine which state the bit belongs to.

The health of a block can be determined by identifying the number of erratic bits. Health may include the estimated lifetime, endurance, or data retention of the block. An identification of erratic bits may be a more accurate reflection of this health than the hot count. Accordingly, the detection and recording of the erratic bits may be utilized in this determination. The detection was discussed above (e.g. FIGS. 6-7) where a programming operation is followed by a read operation to determine if a bit was programmed accurately. The recording (of the erratic bits) may be a table in one embodiment. The recorded number of erratic bits may be stored in the flash memory and/or may be at the system level.

In one example, a table for the number of erratic/failed bits as shown in FIG. 6 for a block with multilevel cells (MLC) may be:

TABLE 1

System parameters and the erratic bit counts for an MLC block

| Parameter | Description | Controlled by | Example Count |
|---|---|---|---|
| F_EPD_A | Check erratic bits between Erase State and A State. | System | 20 |
| F_EPD_B | Check erratic bits between A State and B State. | System | 25 |
| F_EPD_C | Check erratic bits between B State and C State | System | 10 |
| F_BSPF_EPD | Total erratic bits | System/ Device | 55 (total) |

Table 1 is merely exemplary and illustrates how the number of erratic bits may be stored and compared with the threshold value for the erratic bits. In the example shown in Table 1, the total erratic bit count equals the sum of erratic bits from each of the overlapped states described with respect to FIG. 6. While Table 1 illustrates an exemplary MLC block, the following Table 2 illustrates a single level cell (SLC) block. In particular, Table 2 illustrates an additional overlapped state (not shown in FIG. 6) which is between the erase state and the lower-middle (LM) state. FIG. 5 (Lower Page) illustrates the two states and the overlapped state between the two states for SLC memory may be referred to as the LM overlapped state and corresponds with erratic bits between those two states (erase state and LM state).

TABLE 2

System parameters and the erratic bit counts for an SLC block.

| Parameter | Description | Controlled by | Example Count |
|---|---|---|---|
| F_EPD_L | Check erratic bits between Erase State and LM states. | System | 15 |
| F_BSPF_EPD | Total erratic bits | System/Device | 15 (total) |

The blocks by which erratic bits are measured may be either SLC or MLC, so the Table that is utilized will depend on whether the block is SLC or MLC. In an alternative embodiment, there may be a single table (e.g. Table 3) that is used for all blocks (SLC and MLC) that includes erratic bit count. In this embodiment, there will not be erratic bits between the erase and LM states for MLC memory, and there will not be erratic bits between any of the A-C states for SLC memory. However, the use of a uniform table, such as Table 3 may be used regardless of the type of block for simplicity.

TABLE 3

System parameters and the erratic bit counts for any type of block.

| Parameter | Description | Controlled by | Example Count |
|---|---|---|---|
| F_EPD_A | Check erratic bits between Erase State and A State. | System | 20 |
| F_EPD_B | Check erratic bits between A State and B State. | System | 25 |
| F_EPD_C | Check erratic bits between B State and C State | System | 10 |
| F_EPD_L | Check erratic bits between Erase State and LM states. | System | 0 |
| F_BSPF_EPD | Total erratic bits | System/Device | 55 (total) |

In an alternative embodiment, the table that is stored with the erratic bit count may include a block/page identifier and the total erratic bits for each page. In other words, each page will be associated with a count of erratic bits. By adding all of the erratic bits for each page in a block, the total count of erratic bits for a particular block may be determined. The comparison with a threshold may be based on the total number of erratic bits in a block. Alternatively, there may be a "per page" threshold that is compared with the erratic bits per page.

The recording of the erratic bits may be per page. This can be more accurate than the hot count, which is per block. In other words, knowing the erratic bit count for each page can provide a more accurate reflection of health of individual pages and of the block (based on the pages in that block). In alternative embodiments, the erratic bit count and table may be at the block level rather than the page level. This could reduce the storage needed for the table but may also be less accurate. In one example, the number of erratic bits allowed may be 72. Using this value, every page we would need about 7 bits to keep a count of the total number of erratic bits. Accordingly, the space required for this example can be calculated as follows: one wordline=7 bits, and 1 block=128 wordlines (256 pages)=896 bits=112 bytes; 1 Die=2P=4096 blocks=4096*112 bytes=448 Kilobytes (KB). In this example, the storage of the table would require 448 KB for all the blocks of a die.

Figure 8:
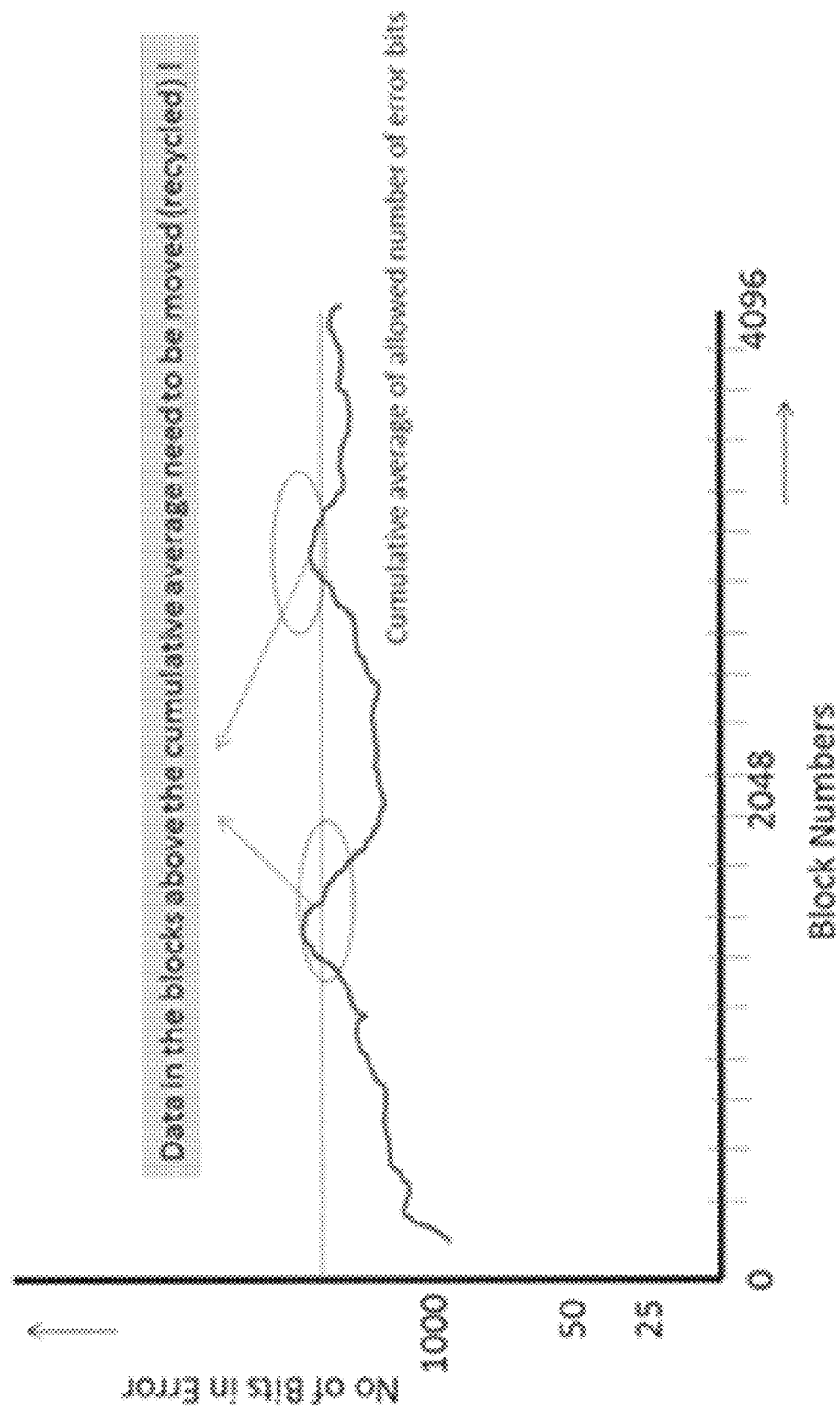
FIG. 8 is a diagram illustrating a block recycling threshold.

Not only can the number of erratic bits be used as a reflection of memory health, but this can be used for identifying blocks to be recycled. In particular, unhealthy blocks should be recycled more frequently than healthy blocks. In one example, a cumulative average threshold of allowed error bits may be used for each block. FIG. 8 is a diagram illustrating a block recycling threshold. In FIG. 8, the total number of erratic bits is obtained from each block and divided by the total number of blocks. This is an example of a cumulative average for the number of erratic bits allowed per block. FIG. 8 illustrates this cumulative average of allowed number of error bits. Accordingly, all the blocks that have erratic bits that are above the cumulative average are the blocks that should be due for being recycled and the data from those blocks can be moved to a new location. This can prevent an uncorrectable error correction code (UECC) which is more likely to occur in blocks that are above the threshold. Once the data in the block with erratic bits is moved to a new block (i.e. recycled), the erratic bit values may be stored to the table and the block may be monitored during idle time. For example, read operations in the block may be used to check to see if the number of erratic bits increases/decreases in value. Changes in the erratic bit count are updated to the table stored in flash.

The cumulative average of allowed number of error bits (in FIG. 8) is merely one example of a threshold that can be used. The threshold is a trigger that identifies when a block requires a certain action. As described above, a block that exceeds the threshold may need to be recycled. The threshold value may be dynamic and can be changed throughout the lifetime of the device. In alternative embodiments, the total erratic bit count may be used to create a list of those blocks (or pages) with the highest erratic bit count. Those are the blocks that are selected for recycling. In this example, the threshold may be a certain number of the highest erratic bit counts (e.g. find the two worst blocks) and is merely a number of blocks that should be recycled. There may be additional threshold values that are used for determining a cut-off regarding those blocks that require action.

The erratic bit counts or erratic programming detection (EPD) described above is an internal NAND measurement of bits in error that provides a mechanism for monitoring system health and for monitoring the health of the user data on flash. Recycling of the blocks is merely one way to utilize this EPD. In particular, the actual recorded number of erratic bits may be a more accurate measurement of block health than hot count. Additional examples of how the EPD may be used to monitor health of block to create a running threshold for monitoring this health. Another example may be for improving health of user data on memory to make sure blocks are cycled as soon as possible. This may be a dynamic process for monitoring the health of the blocks.

FIG. 9 is a diagram of an exemplary process for implementing erratic program detection (EPD). This process may be performed at the system level using firmware. After a power cycle in block 902, the total count of erratic bits for each block and the cumulative average allowed threshold are loaded into RAM in block 904. This may be in the form of a table and may be loaded to RAM from flash memory. In block 906, the device waits for a host command. If there is no write command, then the commands are executed and other host commands are received in block 908. If there is a write command in block 906, then the data is programmed and EPD is initiated in block 910. The programming is performed by the page, so the EPD may be performed after programming of each page.

If the erratic bit count is not less than or equal to the threshold, then a program failure is detected and the block is retired in block 914. In other words, when the erratic bit count exceeds the threshold the block can be recycled or retired. If the erratic bit count is less than or equal to the threshold, then the total EPD failed bits for each wordline are counted and stored in RAM in block 916. The storage in RAM of the table may also be updated in flash. The control structures (e.g. Table) in RAM may be updated with or without the flash version being updated. Once the operation is completed, the flash version may be updated with the updates from the RAM version.

In block 918, a determination is made as to whether the block is full. If the block is not full, then programming continues and erratic bits are detected on each wordline in block 920. If the block is full, then the running cumulative average is updated in block 922. The running cumulative average may be a sum of the erratic bits on each wordline for all the blocks divided by the total number of user blocks. When a block has a total erratic bit count that is greater than the cumulative average threshold, that block is identified in block 924. The identified blocks can then be recycled in block 926, and the device can continue accepting commands from the host in block 928. The updated control structure in RAM may be used to update the data stored in flash. For example, the EPD table which may be temporarily and/or partially stored in RAM may be updated during this process, and those updates may then be made to the EPD table stored in flash.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method for monitoring memory health, the method comprising:
   executing a program operation to write data to one or more pages in a memory block;
   recording a count of erratic bits for each of the one or more pages for the program operation;
   comparing the count of erratic bits with a threshold; and
   recycling blocks where the erratic bits exceed the threshold from the comparison.

2. The method of claim 1 wherein the recording comprises a read operation that verifies the program operation.

3. The method of claim 1 wherein the recording is stored in the memory.

4. The method of claim 1 wherein the recording is temporarily stored in random access memory for quicker access.

5. The method of claim 1 wherein the recording comprises a listing of erratic bit count for each page.

6. The method of claim 1 wherein the threshold comprises a cumulative average.

7. The method of claim 6 wherein the cumulative average is the total number of erratic bits for a plurality of the blocks divided by a total number of the plurality of the blocks.

8. The method of claim 1 wherein the memory comprises a three-dimensional (3D) memory configuration, and wherein a controller is associated with operation of the memory blocks.

9. The method of claim 1 wherein an erratic bit comprises a bit that is programmed to an incorrect state.

10. The method of claim 9 wherein the incorrect state comprises an overlapping state between two states.

11. The method of claim 1 wherein the recycling comprises replacing blocks when the erratic bit count for the block exceeds the threshold.

12. A storage device comprising:
   a state machine that calculates erratic bits for a page following a program operation;
   an erratic program module that records a count of the erratic bits for each page; and
   a media management layer that utilizes the recorded count of the erratic bits for cycling blocks, wherein the blocks that are selected for recycling are those blocks whose cumulative erratic bit count for each page in that block exceeds a threshold.

13. The storage device of claim 12 wherein the state machine, the erratic program module, and the media management layer are part of a controller with the storage device.

14. The storage device of claim 13 wherein the program operation is received from a host device to the controller.

15. The storage device of claim 12 wherein the threshold comprises a total number of erratic bits for a plurality of the blocks divided by a total number of the plurality of the blocks.

16. The storage device of claim 12 wherein the threshold is dynamic and can be adjusted to increase or reduce the recycling of blocks.

17. The storage device of claim 12 wherein the recording of the count is to a table that is stored in the storage device.

18. A method for monitoring a health of a memory device comprising blocks for storage, the method comprising:
   detecting, following a program operation, a number of error bits for each page that is part of the program operation;
   recording the number of error bits for each page;
   identifying a relative health of a block based on a total of the recorded number of error bits from all of the pages in the block; and
   recycling blocks which have a poor relative health, wherein the relative health comprises a comparison of a number of the error bits such that more error bits results in poor relative health.

19. The method of claim 18 wherein the identifying of the relative health comprises:
   comparing the recorded number of error bits with a threshold, wherein blocks under the threshold have a good relative health and blocks above the threshold have a poor relative health.

\* \* \* \* \*